(12) United States Patent
Nabeta et al.

(10) Patent No.: US 10,755,962 B2
(45) Date of Patent: *Aug. 25, 2020

(54) SUBSTRATE PROCESSING APPARATUS AND METHOD OF MANUFACTURING SEMICONDUCTOR DEVICE

(71) Applicant: HITACHI KOKUSAI ELECTRIC INC, Tokyo (JP)

(72) Inventors: Kazuya Nabeta, Toyama (JP); Naoki Ukae, Toyama (JP); Mitsunori Takeshita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 306 days.

This patent is subject to a terminal disclaimer.

(21) Appl. No.: 15/057,954

(22) Filed: Mar. 1, 2016

(65) Prior Publication Data

US 2016/0201196 A1   Jul. 14, 2016

Related U.S. Application Data

(63) Continuation of application No. 12/964,921, filed on Dec. 10, 2010, now Pat. No. 9,305,820.

(30) Foreign Application Priority Data

Dec. 11, 2009 (JP) .................................. 2009-281531
Oct. 18, 2010 (JP) .................................. 2010-233952

(51) Int. Cl.
C23C 16/46        (2006.01)
C23C 16/458       (2006.01)
(Continued)

(52) U.S. Cl.
CPC ...... *H01L 21/68792* (2013.01); *C23C 16/458* (2013.01); *C23C 16/4586* (2013.01);
(Continued)

(58) Field of Classification Search
CPC ... C23C 16/458; C23C 16/4586; C23C 16/46; C23C 16/52; H01J 37/32082;
(Continued)

(56) References Cited

U.S. PATENT DOCUMENTS 6,066,836 A   5/2000  Chen et al.
6,652,655 B1 * 11/2003  Ho ..................... C23C 16/4586
                                                              118/725

(Continued)

FOREIGN PATENT DOCUMENTS

JP    2001-237051 A    8/2001
WO   2009-028458 A1   3/2009

*Primary Examiner* — Benjamin Kendall
(74) *Attorney, Agent, or Firm* — Vople and Koenig, P.C.

(57) ABSTRACT

A stable and highly reliable device for detecting damage or contact failures of respective parts is provided. The device includes a processing chamber for processing a substrate; a heater for heating the substrate; a substrate support accommodating the heater and installed inside the processing chamber; a shaft for supporting the substrate support; a wire inserted through the shaft; a supporting unit for holding the wire; and a temperature detector connected to the supporting unit.

8 Claims, 7 Drawing Sheets

(51) Int. Cl.
  *C23C 16/52* (2006.01)
  *H01J 37/32* (2006.01)
  *H01L 21/67* (2006.01)
  *H01L 21/687* (2006.01)

(52) U.S. Cl.
  CPC .............. *C23C 16/46* (2013.01); *C23C 16/52* (2013.01); *H01J 37/3266* (2013.01); *H01J 37/32082* (2013.01); *H01L 21/67109* (2013.01); *H01L 21/68785* (2013.01)

(58) Field of Classification Search
  CPC ............ H01J 37/3266; H01J 37/32715; H01J 37/32724; H01L 21/67098; H01L 21/67103; H01L 21/67109; H01L 21/68785; H01L 21/68792
  See application file for complete search history.

(56) References Cited

U.S. PATENT DOCUMENTS

| | | | |
|---|---|---|---|
| 7,045,045 B2 | 5/2006 | Natsuhara et al. | |
| 7,981,218 B2 | 7/2011 | Yamashita | |
| 2001/0042744 A1* | 11/2001 | Tachikawa | H01L 21/67103 219/444.1 |
| 2003/0051665 A1 | 3/2003 | Zhao et al. | |
| 2003/0089699 A1* | 5/2003 | Hiramatsu | H01L 21/67109 219/444.1 |
| 2005/0008983 A1* | 1/2005 | Wang | H01L 21/67109 432/81 |
| 2005/0217799 A1* | 10/2005 | O'Meara | H01L 21/67109 156/345.52 |
| 2005/0235918 A1* | 10/2005 | Kojima | C23C 16/4409 118/733 |
| 2006/0207120 A1* | 9/2006 | Komatsu | H01L 21/67103 34/79 |
| 2008/0017111 A1* | 1/2008 | Ishisaka | H01J 37/32082 118/723 E |
| 2008/0163818 A1 | 7/2008 | Saito et al. | |
| 2008/0271471 A1* | 11/2008 | Nozawa | C23C 16/4411 62/179 |
| 2009/0179365 A1* | 7/2009 | Lerner | B25B 11/005 269/21 |
| 2010/0162956 A1* | 7/2010 | Murakami | C23C 16/4586 118/725 |
| 2010/0163188 A1 | 7/2010 | Tanaka et al. | |

* cited by examiner

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application is a continuation of U.S. patent application Ser. No. 12/964,921 filed on Dec. 10, 2010, and claims priority under 35 U.S.C. § 119 of Japanese Patent Applications No. 2009-281531 filed on Dec. 11, 2009 and No. 2010-233952 filed on Oct. 18, 2010, in the Japanese Patent Office, the entire contents of which are hereby incorporated by reference.

BACKGROUND OF THE INVENTION

1. Field of the Invention

The present invention relates to a substrate processing apparatus for processing a substrate using a heating device installed in a substrate support and a method of manufacturing a semiconductor device.

2. Description of the Related Art

In the procedure of processing a substrate, the substrate is processed by heating the substrate to a predetermined temperature. Conventionally, a single substrate processing apparatus employs a heating device such as a lamp and an electric resistance heating device installed around a substrate support for supporting the substrate to heat the substrate.

The electric resistance heating device is provided with a predetermined electric power by a power source for heating the same, and the substrate is then heated by a thermal conduction from the heated electric resistance heating device. However, when the apparatus is continuously operated, the electric resistance heating device or other parts is destroyed or deteriorated, which results in a contact failure. Therefore, the reliability of the apparatus may be notably deteriorated, for example, failing to heat the substrate to a desired temperature or failing to heat the substrate at all.

SUMMARY OF THE INVENTION

In order to solve the above-described problems, the object of the present invention is to provide a stable and highly reliable substrate processing apparatus and a method of manufacturing a semiconductor device which are free of unstable heating due to a damage or a contact failures of respective parts.

According to one embodiment of the present invention, there is provided a substrate processing apparatus including: a processing chamber configured to process a substrate; a first heater and a second heater configured to heat the substrate; a substrate support disposed in the processing chamber, the substrate support accommodating the heater therein; a shaft supporting the substrate support; a first wire inserted through the shaft, the first wire including a first heater power supply line, a first connection mechanism and a first heater wire having a first end connected to the first heater and a second end connected to the first heater power supply line via the first connection mechanism; a second wire inserted through the shaft, the second wire including a second heater power supply line, a second connection mechanism and a second heater wire having a first end connected to the second heater and a second end connected to the second heater power supply line via the second connection mechanism; and a supporting unit including a first partition installed between the first heater power supply line and the second heater power supply line, the supporting unit holding the first heater power supply line, the first connection mechanism, the second heater power supply line and the second connection mechanism.

According to another embodiment of the present invention, there is provided a method for manufacturing a semiconductor device using a substrate processing apparatus, the apparatus including a processing chamber for processing a substrate; a heater for heating the substrate; a substrate support accommodating the heater and installed inside the processing chamber; a shaft for supporting the substrate support; a wire inserted through the shaft; a supporting unit for holding the wire; and a temperature detector connected to the supporting unit, the method including steps of: (a) supporting the substrate by the substrate support in the processing chamber; and (b) heating the substrate supported by the substrate support using the heater accommodated in the substrate support, and wherein the temperature detector detects a temperature of the supporting unit during the step (b).

According to the present invention, it is possible to provide a stable and highly reliable substrate processing apparatus which is free of unstable heating due to damage or contact failures of respective parts, and a method of manufacturing a semiconductor device.

DETAILED DESCRIPTION OF THE PREFERRED EMBODIMENTS

As described above, when an apparatus continuously operated, the electric resistance heating device or other parts is destroyed or deteriorated. This is considered to be caused by a deformation of the parts during the heating process and a deterioration of the parts with time lapse.

Hereinafter, a substrate processing apparatus with stability and high reliability despite the deformation by the heat and the deterioration with time lapse of the parts will be described.

(1) Configuration of Substrate Processing Apparatus

Figure 1:
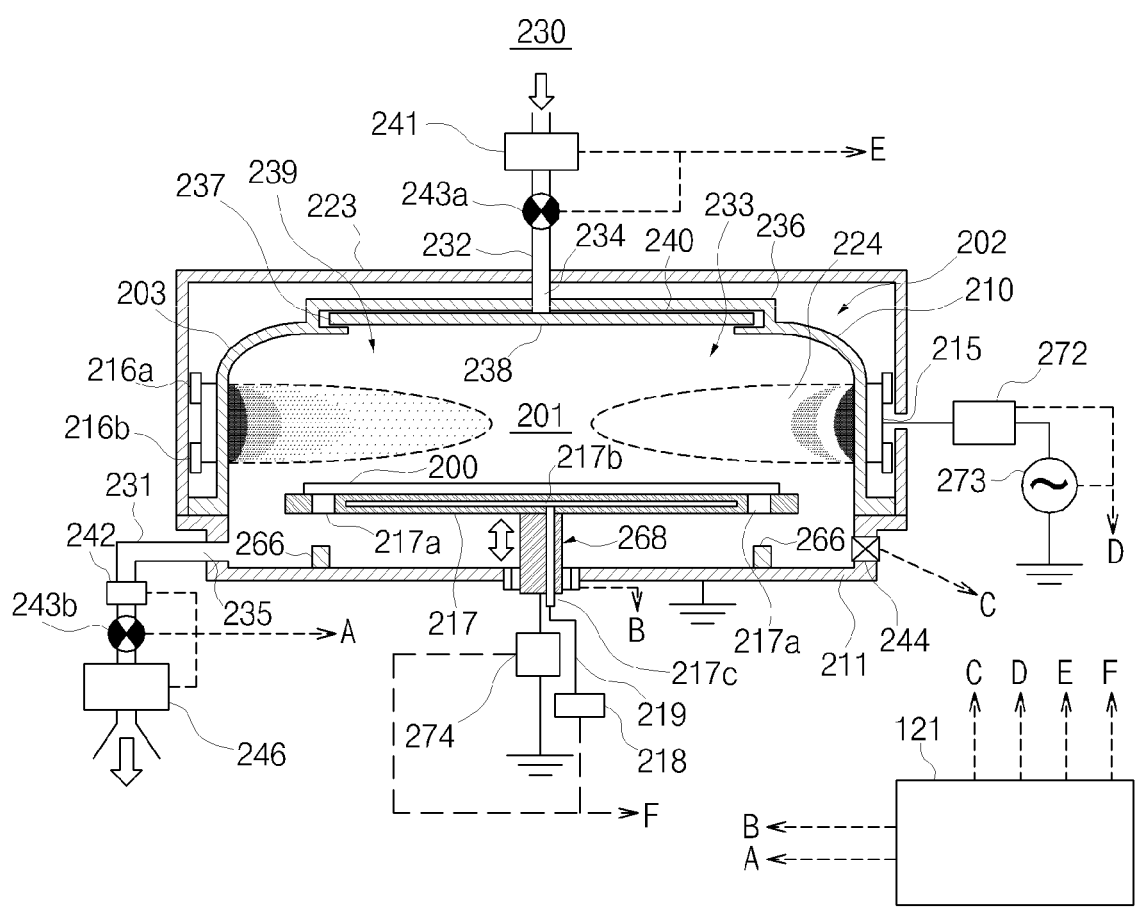
FIG. 1 is a cross-sectional view of a substrate processing apparatus according to an embodiment of the present invention.

First, an example configuration of a substrate processing apparatus, which performs a method of manufacturing a semiconductor device according to an embodiment of the present invention, will be described with reference to FIG. 1. FIG. 1 is a cross-sectional view of an MMT (modified magnetron type) apparatus which is above-described substrate processing apparatus. The MMT apparatus is a plasma processing apparatus for processing a silicon substrate 200 such as silicon wafers using an MMT plasma source that can generate a high density plasma by means of an electric field and a magnetic field.

The MMT apparatus includes a processing furnace 202 for plasma-processing the silicon substrate 200 as the substrate. The processing furnace 202 includes a processing container 203 constituting a processing chamber 201, a susceptor 217, a gate valve 244, a shower head 236, a gas exhaust port 235, a plasma generating mechanism (a cylindrical electrode 215, an upper magnet 216a, and a lower magnet 216b) and a controller 121.

The processing container 203 constituting the processing chamber 201 includes a dome-type upper container 210 as a first container and a bowl-shaped lower container 211 as a second container. The processing chamber 201 is formed by covering the lower container 211 with the upper container 210. The upper container 210 is made of a non-metallic material such as an aluminum oxide and the quartz, and the lower container 211 is made of an aluminum.

The susceptor 217 is disposed in the bottom center of the processing chamber 201 as a substrate supporting unit for supporting the silicon substrate 200. The susceptor 217 is made of a non-metallic material such as, for example, an aluminum nitride, ceramics, a the quartz to reduce a metal contamination of films formed on the silicon substrate 200. The susceptor 217 includes a planar substrate support 500 (see FIG. 5) for supporting a substrate horizontally from below, and a tubular, i.e., a cylindrical shaft 268 (see FIG. 1, 2) for supporting the substrate support 500 horizontally from below.

A heater 217b is accommodated and integrally embedded as a heating unit inside the susceptor 217 (specifically, inside the substrate support 500), and is capable of heating the silicon substrate 200. A first end of a heater wire 217c is connected to the heater 217b. A second end of the heater wire 217c is connected to a power source 218 for heaters via a heater power supply line 219. When an electric power is supplied from the power source 218 for heaters via the heater power supply line 219 and the heater wire 217c, the heater 217b is heated. Thereafter, the surface of the silicon substrate 200 may be heated to approximately 450° C. to 900° C., for example, by radiant heat from the heater 217b. The heater 217b, the heater wire 217c and the heater power supply line 219 will be described later in detail.

The susceptor 217 is electrically insulated from the lower container 211. As an electrode for changing impedance, a second electrode (not shown) is mounted inside the susceptor 217. This second electrode is grounded via an impedance variable unit 274. The impedance variable unit 274 includes a coil or a variable condenser, and an electric potential of the silicon substrate 200 may be controlled via the second electrode (not shown) and the susceptor 217 by controlling the number of patterns of the coil and a capacitance of the variable condenser.

A susceptor elevation unit (not shown) for elevating the susceptor 217 is installed in the susceptor 217. A through hole 217a is installed in the susceptor 217. Wafer lifting pins 266 for pushing up the silicon substrate 200 are installed in at least three places of a bottom surface of the above-described lower container 211. Also, the through hole 217a and the wafer lifting pins 266 are mutually disposed such that, when the susceptor 217 is lowered by the susceptor elevation unit, the wafer lifting pins 266 penetrate the through hole 217a while the wafer lifting pins 266 are not in contact with the susceptor 217.

The gate valve 244 is installed as a slit valve on a sidewall of the lower container 211. When the gate valve 244 is opened, the silicon substrate 200 may be loaded into the processing chamber 201, or the silicon substrate 200 may be unloaded from the processing chamber 201 using a transfer unit (not shown). An inner part of the processing chamber 201 may be air-tightly closed by closing the gate valve 244.

The shower head 236 for dispersing a gas supplied into the processing chamber 201 is installed in an upper part of the processing chamber 201. The shower head 236 includes a cap-shaped lid 233, a gas introduction port 234, a buffer chamber 237, an opening 238, a shielding plate 240, and a gas discharge port 239.

A gas supply pipe 232 for supplying a gas into the buffer chamber 237 is connected to the gas introduction port 234. The buffer chamber 237 functions as a dispersion space for dispersing a reactive gas 230 introduced through the gas introduction port 234.

Further, the gas supply pipe 232 is connected to a nitrogen gas cylinder (not shown) for supplying an $N_2$ gas as a nitrogen-containing gas (reactive gas) via a valve 243a as a switch valve and a mass flow controller 241 as a flow rate controller. Also, the gas supply pipe 232 is connected to a hydrogen gas cylinder (not shown) for supplying a $H_2$ gas as a hydrogen-containing gas such that the hydrogen-containing gas (reactive gas) can be supplied into the processing chamber 201. Similarly, the gas supply pipe 232 is also connected to a gas cylinder (not shown) for a noble gas such that the noble gas can be supplied as a diluent gas into the processing chamber 201. Each of the gas cylinders includes a valve such as a switch valve. Each of the reactive gas and/or the noble gas may be supplied into the processing chamber 201 via the gas supply pipe 232 by switching on and off these valves and the valve 243a. In general, a gas supply unit includes the gas supply pipe 232, the valve 243a, and the mass flow controller 241.

Here, the use of the gas cylinder for each of the $N_2$ gas, the $H_2$ gas and the noble gas is described, but the present invention is not limited thereto. Preferably, an ammonia gas cylinder can be installed instead of the gas cylinders. In addition, as a ratio of nitrogen in the reactive gas increases, additional nitrogen gas cylinders may be installed.

The gas exhaust port 235 for exhausting a gas from the processing chamber 201 is provided on a sidewall of the lower container 211. A gas exhaust pipe 231 for exhausting a gas is connected to the gas exhaust port 235. An automatic pressure controller (APC) 242 as a pressure regulator, a valve 243b as a switch valve and a vacuum pump 246 as an exhaust device are sequentially installed in the gas exhaust pipe 231 from an upstream side thereof. Generally, an exhaust unit includes the gas exhaust pipe 231, the APC 242, and the valve 243b.

The cylindrical electrode 215 is installed as a first electrode in a circumference of the processing container 203 (an upper container 210) to surround a plasma generation region 224 inside the processing chamber 201. The cylindrical electrode 215 has a form of a tube, for example, a cylinder. The cylindrical electrode 215 is connected to a high frequency power source 273 for applying a high frequency power via a matching unit 272 for performing an impedance matching. The cylindrical electrode 215 functions as a discharge unit for exciting, by plasma, the reactive gas supplied to the processing chamber 201.

The upper magnet 216a and the lower magnet 216b are installed in upper and lower ends of the outer surface of the cylindrical electrode 215, respectively. The upper magnet 216a and the lower magnet 216b are permanent magnets having the form of the tube, for example, the cylinder.

The upper magnet 216a and the lower magnet 216b include magnetic poles at both ends, i.e., an inner circumferential end and an outer circumferential end, of the processing chamber 201 along a radial direction of the processing chamber 201. The magnetic poles of the upper magnet 216a and the lower magnet 216b are disposed in opposite directions to be disposed in up and down positions. That is, the magnetic poles in the inner circumferences of the upper magnet 216a and the lower magnet 216b have different polarities. Therefore, the magnetic field in a cylindrical axis direction is formed along an inner surface of the cylindrical electrode 215.

After the reactive gas is introduced into the processing chamber 201, a magnetron discharge plasma is generated in the processing chamber 201 by supplying the high frequency power to the cylindrical electrode 215 to form an electric field and simultaneously form the magnetic field using the upper magnet 216a and the lower magnet 216b. In this case, the emitted electrons are orbited by the above-described electromagnetic field, and thus a plasma ionization rate is increased and a plasma with a long life span and a high density may be generated.

Also, a metallic shielding plate 223 for effectively shielding an electromagnetic field is installed around the cylindrical electrode 215, the upper magnet 216a, and the lower magnet 216b such that the electromagnetic field formed by the cylindrical electrode 215, the upper magnet 216a, and the lower magnet 216b cannot negatively affect an external environment or other devices such as a processing furnace.

Also, the controller 121 is configured as a control unit to control the APC 242, the valve 243b, and the vacuum pump 246 through a signal line A, the susceptor elevation unit through a signal line B, the gate valve 244 through a signal line C, the matching unit 272 and the high frequency power source 273 through a signal line D, the mass flow controller 241 and the valve 243a through a signal line E, and the power source 218 for heaters or the impedance variable unit 274 embedded in the susceptor through a signal line F in FIG. 1.

Figure 2:
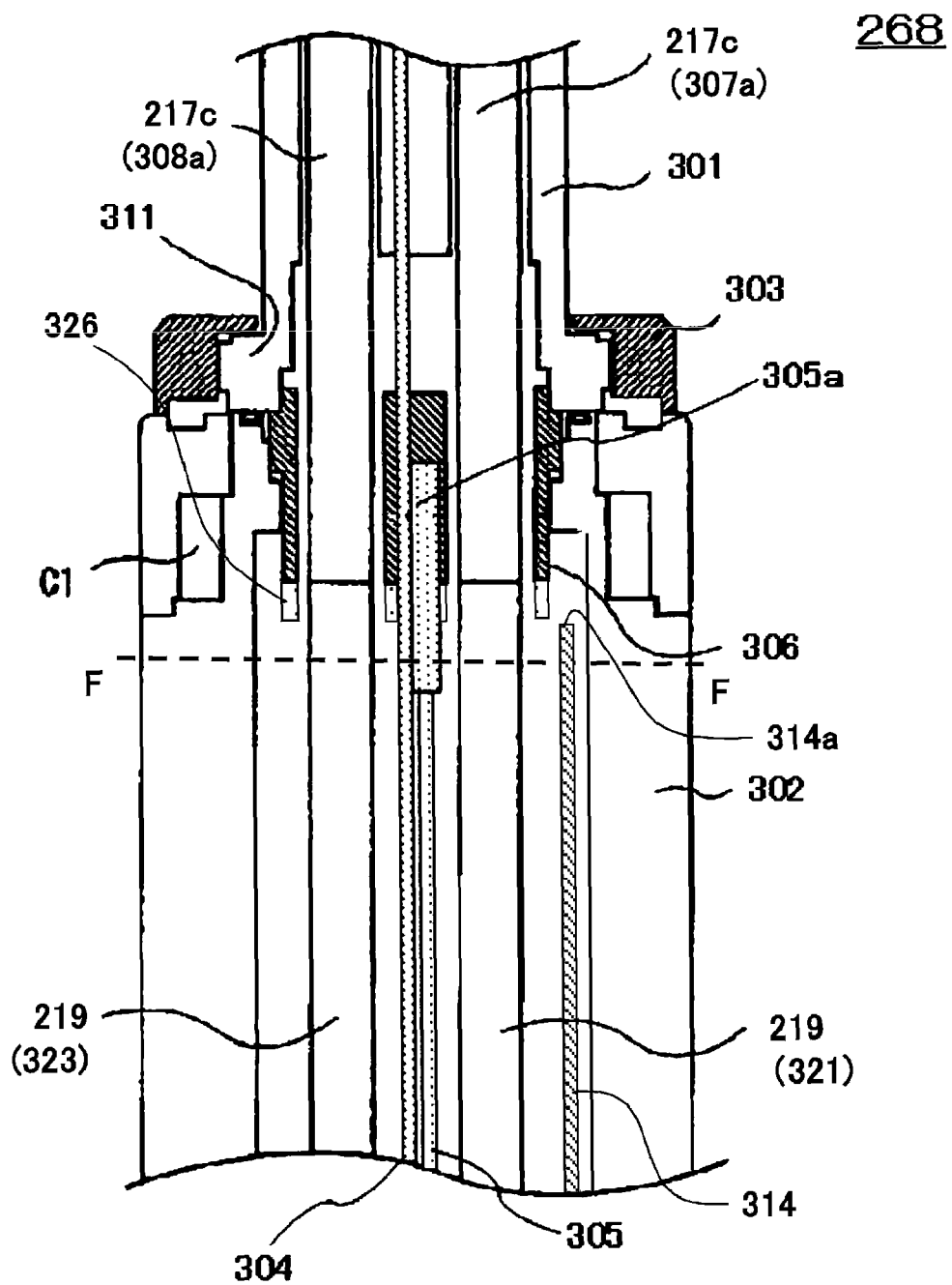
FIG. 2 is a vertical cross-sectional view of a shaft of a substrate processing apparatus according to an embodiment of the present invention.
Figure 3:
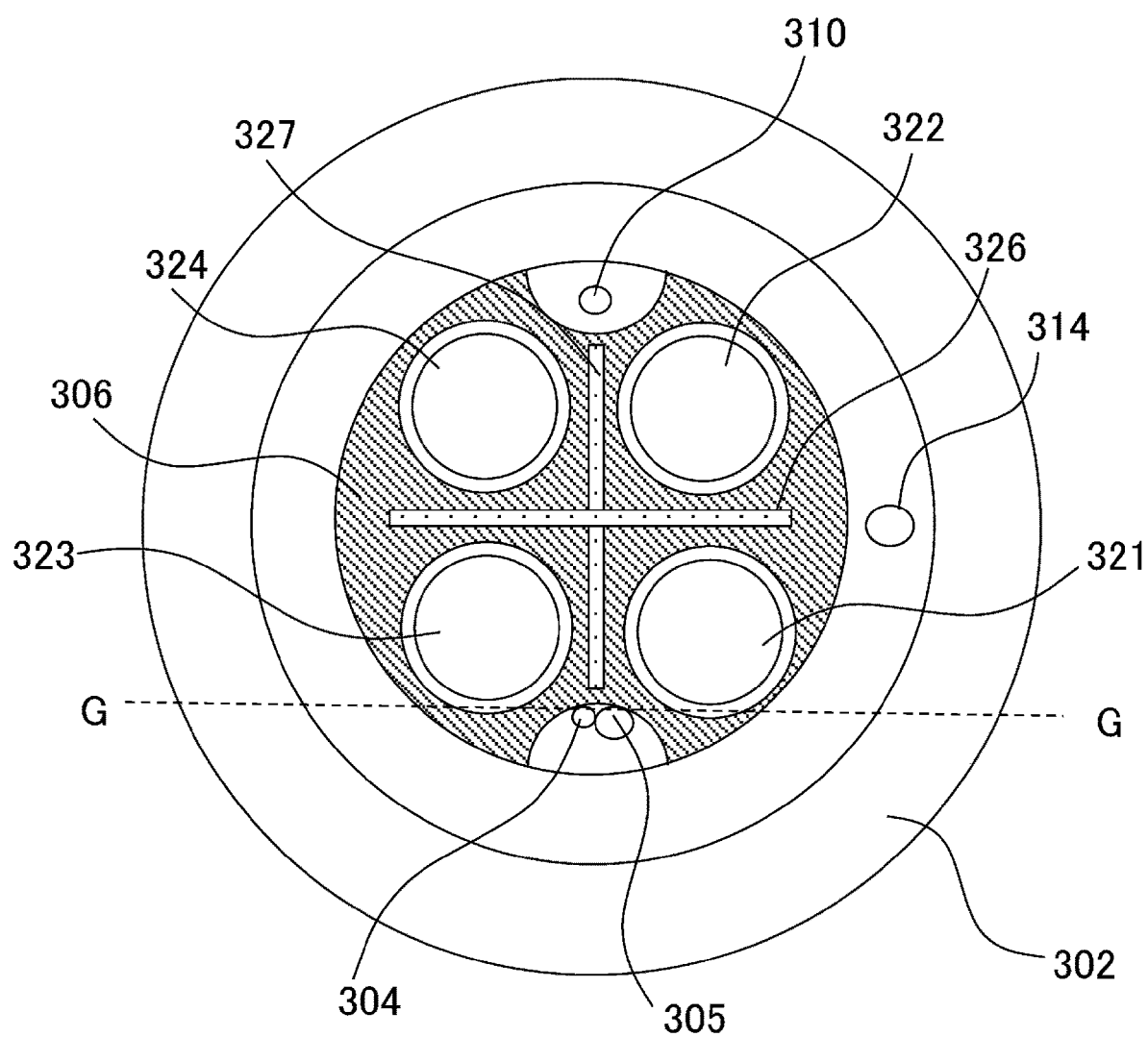
FIG. 3 is a horizontal cross-sectional view of the shaft of the substrate processing apparatus according to an embodiment of the present invention.
Figure 4:
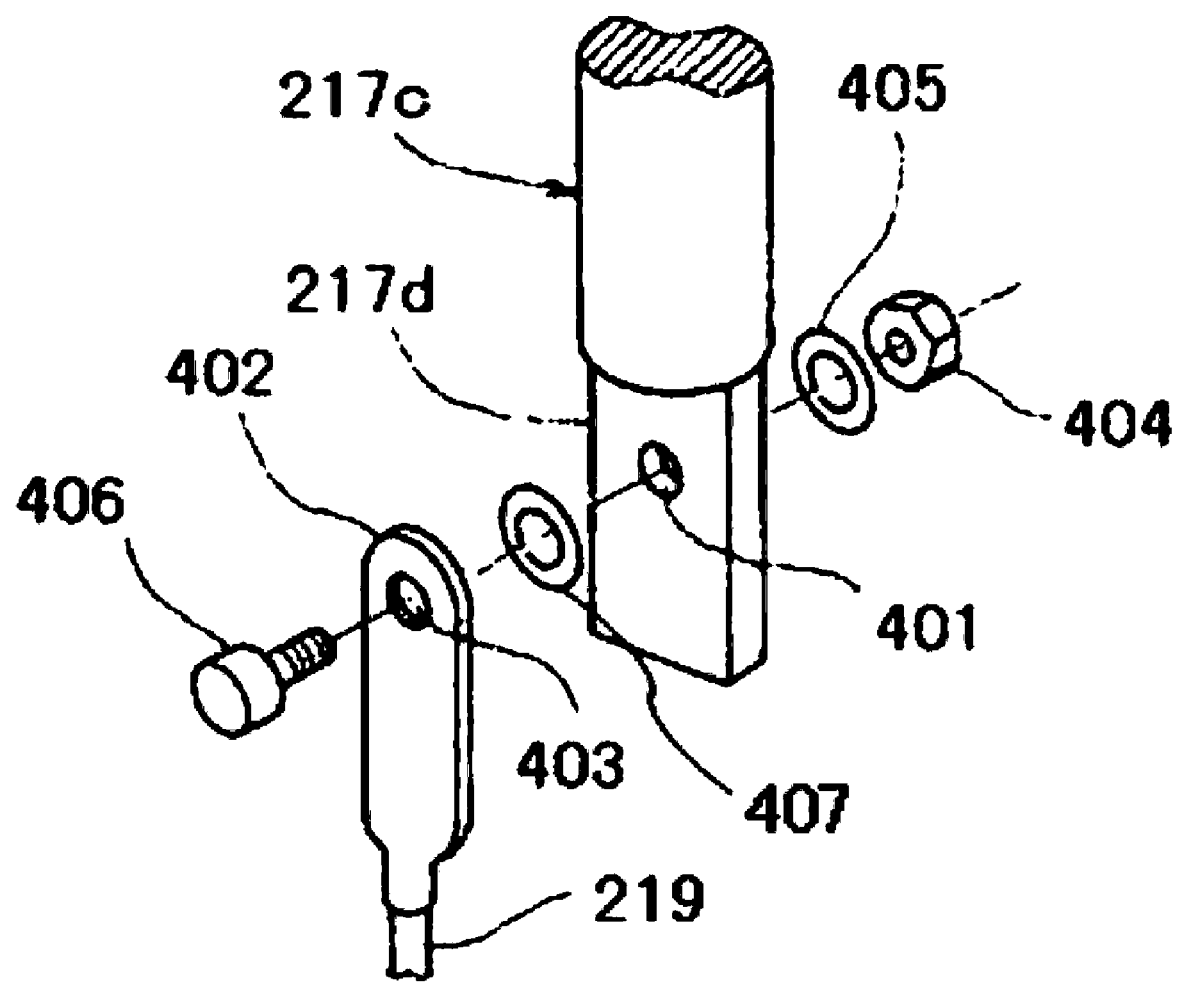
FIG. 4 is a partial enlarged view of a heater terminal connector in the substrate processing apparatus according to an embodiment of the present invention.
Figure 5:
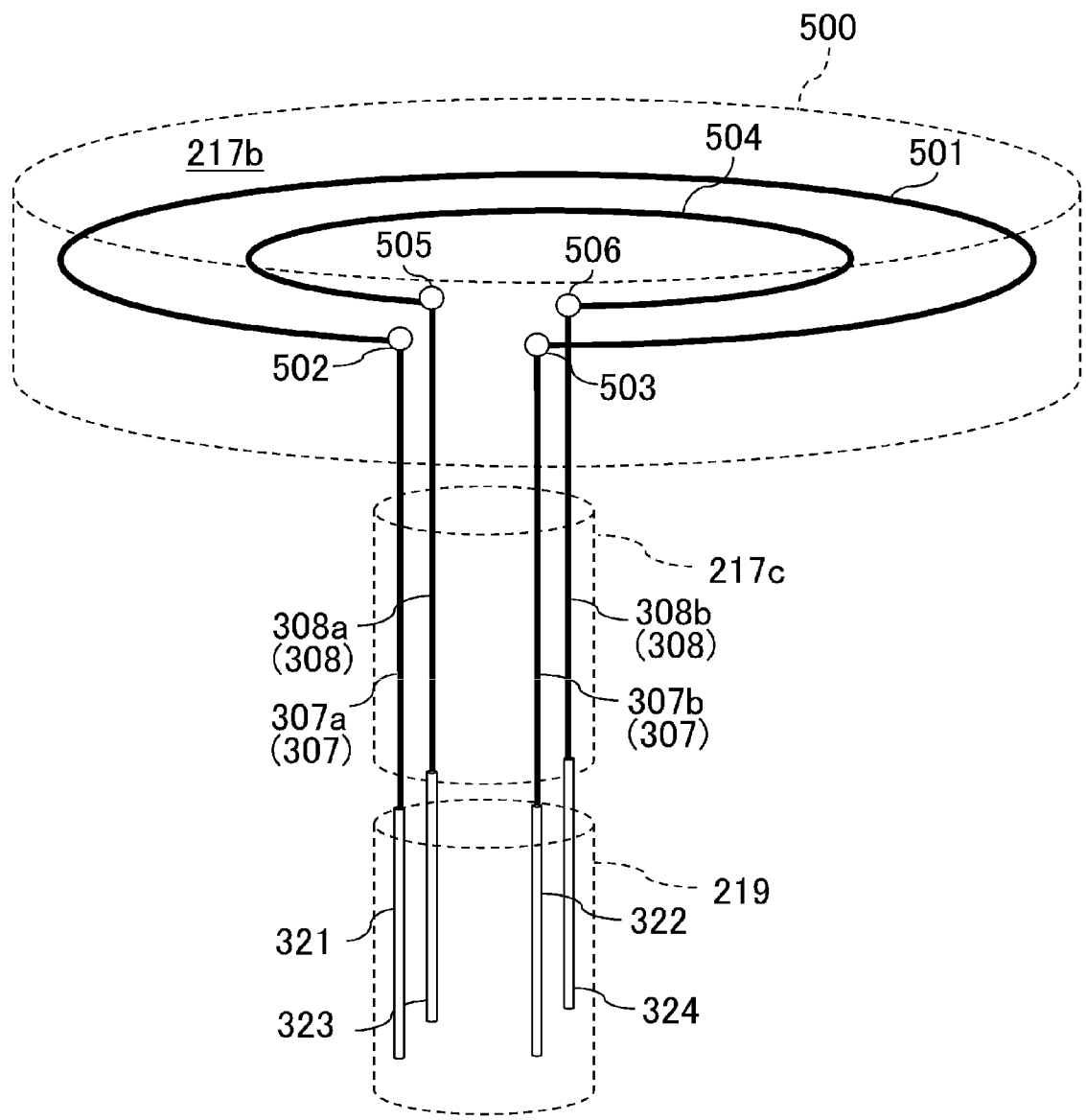
FIG. 5 is an explanatory diagram of a heater and its surroundings disposed in a substrate support in a substrate processing apparatus according to an embodiment of the present invention.

Subsequently, a connection unit between the heater wire 217c and the heater power supply line 219 and its peripheral configuration will be described with reference to FIGS. 2, 3, 4 and 5. FIG. 2 is a vertical cross-sectional view of the shaft 268, and FIG. 3 is a horizontal cross-sectional view of the shaft 268. Also, FIG. 3 is a horizontal cross-sectional view taken along line F-F of FIG. 2, and FIG. 2 is a vertical cross-sectional view taken along line G-G of FIG. 3. FIG. 4 is a partial enlarged view of a heater terminal connector, that is, a connection unit between the heater wire 217c and the heater power supply line 219. FIG. 5 is a diagram for explaining the heater 217b disposed inside the substrate support 500 and its peripheral configuration.

As shown in FIG. 5, the heater 217b accommodated in the substrate support 500 includes an outer heater 501 as a first heater and an inner heater 504 as a second heater. Each of the outer heater 501 and the inner heater 504 has a ring shape, and concentrically disposed such that the outer heater 501 can be placed in a relatively outer position and the inner heater 504 can be placed in a relatively inner position. An input terminal 502 for receiving the electric power and an output terminal 503 for outputting the electric power are installed in both ends of the outer heater 501, respectively. Also, an input terminal 505 for receiving the electric power and an output terminal 506 for outputting the electric power are installed in both ends of the inner heater 504, respectively. Each heater is heated by supplying the electric power from the input terminals toward the output terminals.

The heater wire 217c includes a heater wire 307 for the outer heater 501 and a heater wire 308 for the inner heater 504. Each of the heater wires 307 and 308 includes heater wires 307a and 308a disposed at an input side thereof, and heater wires 307b and 308b disposed at an output side thereof. Also, the heater power supply line 219 includes an outer heater power supply line 321 (input), an outer heater power supply line 322 (output), an inner heater power supply line 323 (input) and an inner heater power supply line 324 (output). The heater wire 307a disposed at the input side of the heater wire 307 has a first end thereof connected to the input terminal 502 of the outer heater 501 and a second end connected to the outer heater power supply line 321 (input). The heater wire 307b disposed at the output side of the heater wire 307 has a first end thereof connected to the output terminal 503 of the outer heater 501 and a second end connected to the outer heater power supply line 322 (output). The heater wire 308a disposed at the input side of the heater wire 308 has a first end thereof connected to the input terminal 505 of the inner heater 504 and a second end connected to the inner heater power supply line 323 (input). The heater wire 308b disposed at the output side of the heater wire 308 has a first end thereof connected to the output terminal 506 of the inner heater 504 and a second end connected to the inner heater power supply line 324 (output). A configuration of a connection mechanism between the heater wire 217c and the heater power supply line 219 will be described later.

In general, a wire inserted through the shaft 268 is constituted by the heater wire 217c, the heater power supply line 219, and their connection mechanism (which will be described later). Also, a first wire for supplying the electric power to the outer heater 501 as the first heater is generally constituted by the heater wire 307 (the heater wires 307a and 307b), the outer heater power supply line 321, the outer heater power supply line 322, and their connection mechanisms (which will be described later). Also, a second wire for supplying the electric power to the inner heater 504 as the second heater is generally constituted by the heater wire 308 (the heater wires 308a and 308b), the inner heater power supply line 323, the inner heater power supply line 324, and their connection mechanisms (which will be described later).

As shown in FIG. 2, the heater wire 217c (denoted by reference numerals 307a and 308a in FIG. 2) is disposed inside a cylindrical shaft top 301 included in the above-described shaft 268. Also, a heater power supply line 219 (denoted by reference numerals 321 and 323 in FIG. 2) is disposed inside a cylindrical shaft base 302 included in the shaft 268. The shaft top 301 is disposed on the shaft base 302 such that a shaft fixing member 303 can be fixed to a flange 311 of the shaft top 301, and thus the shaft top 301 is fixed to the shaft base 302. In general, the shaft 268 includes the shaft top 301, the shaft base 302, the shaft fixing member 303, and the flange 311.

Each of the wires (the heater wire 217c, the heater power supply line 219, and their connection mechanism (which will be described later)) is held by a holder 306 as a supporting unit. Specifically, the connection mechanism between the heater wire 217c and the heater power supply line 219 is held by the holder 306. The holder 306 is installed inside the shaft 268, particularly, inside the connection unit between the shaft top 301 and the shaft base 302, and elongated in a lengthwise direction of each wire.

A purge gas supply pipe 314 having a purge gas supply unit as a gas supply unit disposed therein is arranged between the holder 306 and an inner wall of the shaft 268 having the holder 306 installed therein (specifically, an inner wall of the shaft base 302), and arranged in the vicinity of the outer heater power supply line 321 and the outer heater power supply line 322, which are connected to the heater wires 307a and 307b for the outer heater 501, respectively. More specifically, the purge gas supply pipe 314 is installed in a position which is seen from the inner heater power supply line 323 and the inner heater power supply line 324 beyond the outer heater power supply line 321 and the outer heater power supply line 322, as shown in FIG. 3. That is, the outer heater power supply line 321 and the outer heater power supply line 322 are installed between the purge gas supply pipe 314 and the inner heater power supply lines 323 and 324.

As a gas supply mechanism for injecting a purge gas, a purge gas supply hole 314a is installed in an upper end of the purge gas supply pipe 314. A distance between the purge gas supply hole 314a and the connection mechanism connected to the outer heater 501 (a connection mechanism between the outer heater power supply lines 321 and 322 and the heater wires 307a and 307b) is shorter than a distance between the purge gas supply hole 314a and the connection mechanism connected to the inner heater 504 (a connection mechanism between the inner heater power supply lines 323 and 324 and the heater wires 308a and 308b). Therefore, the purge gas injected from the purge gas supply hole 314a flows from the outer heater power supply lines 321 and 322 toward the inner heater power supply lines 323 and 324. That is, the purge gas injected from the purge gas supply hole 314a first purges the surroundings of the connection mechanism between the outer heater power supply lines 321 and 322 and the heater wires 307a and 307b, flows toward the inner heater power supply lines 323 and 324 and then purges the surroundings of the connection mechanism between the inner heater power supply lines 323 and 324 and the heater wires 308a and 308b. When the purge gas is supplied as described above, each wire or each connection mechanism is cooled, and oxidation of the connection mechanisms is simultaneously prevented.

However, the outer heater 501 and the inner heater 504 are included in the substrate support 500 made of quartz, as described above. Since the outer heater 501 is positioned adjacent to a side surface of the substrate support 500, the heat is easily emitted from the side surface of the substrate support 500, and a temperature thereof does not rise easily. In the substrate processing apparatus, a uniform in-plane heating of the silicon substrate 200 is required. However, since the heat is emitted from the outer heater 501 as described above, a temperature of an outer portion (outer circumferential portion) of the silicon substrate 200 may be lower than that of an inner portion (a central portion) of the silicon substrate 200 when a constant electric power (the same electric power) is supplied to the inner heater 504 and the outer heater 501. Therefore, in accordance with the embodiment, an electric power higher than the electric power supplied to the inner heater 504 is supplied to the outer heater 501. As a result, the heat emitted from the side surface of the substrate support 500 is compensated and achieve the uniform in-plane heating of the silicon substrate 200.

When the higher electric power is supplied to the outer heater 501 compared to the inner heater 504, the outer heater power supply lines 321 and 322 and the respective wires (the heater wires 307a and 307b) connected to the outer heater 501 have a higher thermal load than the inner heater power supply lines 323 and 324 and the respective wires (the heater wires 308a and 308b) connected to the inner heater 504, which leads to an increase in a damage caused by the thermal load. In particular, a temperature of the connection mechanisms between the outer heater power supply lines 321 and 322 and the heater wires 307a and 307b rises easily and a damage rate is increased, as described later. Therefore, the respective wires connected to the outer heater 501 or the connection mechanisms may be primarily cooled and the damage thereof may be reduced by supplying the purge gas to flow from the outer heater power supply lines 321 and 322 toward the inner heater power supply lines 323 and 324 so as to first purge the surroundings of the connection mechanisms between the outer heater power supply lines 321 and 322 and the heater wires 307a and 307b and then purge the surroundings of the connection mechanisms between the inner heater power supply lines 323 and 324 and the heater wires 308a and 308b as described above.

As shown in FIGS. 2 and 3, a first thermocouple 304 and a second thermocouple 305 as a temperature detector are disposed together in one side surface of the holder 306 in a position away from the connection mechanism. A front end of the first thermocouple 304 is installed in the substrate support 500, and configured to measure a temperature of the silicon substrate 200. A front end 305a of the second thermocouple 305 is fixed to the holder 306, and configured to measure a temperature of the holder 306.

The holder 306 is made of a material that linearly conveys a temperature, for example, ceramics, etc. Therefore, the second thermocouple 305 may indirectly detect the temperature of the connection mechanism between the heater wire 217c and the heater power supply line 219 by detecting the temperature of the holder 306. That is, because the temperature of the connection mechanism is linearly conveyed, the holder 306 may easily detect (estimate) the temperature (a change in temperature) of the connection mechanism by detecting the temperature (change in temperature) of the holder 306. Because the second thermocouple 305 is installed in the position away from the connection mechanism, the temperature of the holder 306 detected by the second thermocouple 305 is lower than an actual temperature of the connection mechanism.

The surroundings of the connection mechanism between the heater wire 217c and the heater power supply line 219 are heated to a very high temperature when the heat is generated by deterioration of the parts, such as a washer 407, of the connection mechanism (see FIG. 4), as will be described later. When the temperature is directly detected at a high temperature, it is necessary to use a highly-priced thermocouple that may be used at a high temperature, which leads to an obstacle in providing low cost apparatuses. Also, when the thermocouple is disposed in the vicinity of the connection mechanism, it is necessary to perform a maintenance task at a high temperature, or perform a maintenance task after taking a very long cooling time. Therefore, it is not preferable in terms of maintenance. On the other hand, in accordance with the embodiment of present invention, the first thermocouple 304 is installed in the position away from the connection mechanism, and the temperature of the holder 306 detected by the second thermocouple 305 is lower than the actual temperature of the connection mechanism as described above. Therefore, it is not necessary to use the highly-priced high-temperature thermocouple as the second thermocouple 305, and thus the cost of the substrate processing apparatus can be reduced. Also, since the second thermocouple 305 is used at the lower temperature, the deterioration of the second thermocouple 305 may be prevented and the maintenance task thereof may be carried out without difficulty.

Also, when the temperature of the outer heater 501 or the inner heater 504 is increased, the temperature of the holder 306 also increases due to the thermal conduction or radiation. Therefore, the temperature of the outer heater 501 or the inner heater 504 may be indirectly detected by detecting the temperature of the holder 306. For example, it can be judged whether the detected temperature reaches the temperature with possibility of damaging the outer heater 501 or the inner heater 504 by detecting the temperature of the holder 306. Also, since the second thermocouple 305 is installed in the position away from the outer heater 501 or the inner heater 504, the temperature of the holder 306 detected by the second thermocouple 305 is lower than an actual temperature of the outer heater 501 or the inner heater 504.

A temperature data detected by the second thermocouple 305 is transmitted to the controller 121. When the temperature of the holder 306, that is, the indirectly detected temperature of the connection mechanism between the heater wire 217c and the heater power supply line 219, or the indirectly detected temperature of the outer heater 501 or the inner heater 504, exceeds a predetermined temperature, the controller 121 adjusts the power supply to the inner heater 504 and the outer heater 501 so as to decrease the temperature. The term 'predetermined temperature' used herein means a temperature at which the connection mechanism between the heater wire 217c and the heater power supply line 219 is not damaged, or a temperature at which the inner heater 504 or the outer heater 501 is not damaged, as will be described later. Such control scheme will be described later.

As shown in FIG. 3, in accordance with the embodiment of present invention, the first and second thermocouples 304 and 305 may also be disposed on the side surface of the holder 306. That is, in accordance with the embodiment of present invention, in order to dispose the first and second thermocouples 304 and 305 adjacent to each other, through holes may be added to the holder 306 (through holes for the first and second thermocouples 304 and 305 are installed, respectively), which can be carried out easily. Also, since the first and second thermocouples 304 and 305 may share a fixing means, the number of parts can effectively reduced.

As shown in FIG. 3, a wire 310 for electrodes is also disposed on the side surface of the holder 306 according to the embodiment of the present invention. A first end of the wire 310 for electrodes is connected to the impedance variable unit 274, and a second end thereof is connected to a second electrode (not shown) installed inside the susceptor 217. As described above, the impedance of the susceptor 217 (an electric potential of the silicon substrate 200) may be adjusted by adjusting the impedance variable unit 274.

As shown in FIG. 3, a partition is also installed between the respective heater power supply lines 219 in the holder 306 according to this embodiment. Specifically, a partition 327 is installed between the outer heater power supply lines 321 and 322 and the inner heater power supply lines 323 and 324. Also, a partition 326 is installed between the outer heater power supply line 321 and the outer heater power supply line 322 and between the inner heater power supply line 323 and inner heater power supply line 324 in a manner that the partition 326 crosses the partition 327. That is, the partition 326 is installed between an input wire and an output wire of the power supply line. Even when the wires or the connection mechanisms are damaged, the wires are prevented from coming in contact with adjacent wires by the partitions. That is, an electrical adverse effects caused by the contact with wires (such as a failure caused by excessive current flow) may be prevented.

Also, the partition 327, which is configured to oppose the flow of a purge gas, is configured to have a shorter length than the partition 326 crossing the partition 327. This is for the following object in addition to the object of securing arrangement spaces of the first thermocouple 304, the second thermocouple 305 and the wire 310 for electrodes. That is, in order to effectively supply the purge gas supplied from the purge gas supply hole 314a to the inner heater power supply line 326 and the inner heater power supply line 327, the partitions have such a structure that the partitions do not interfere with the flow of the purge gas.

As shown in FIG. 2, a space C1, which is defined by the shaft base 302 and the shaft fixing member 303, is also present in the shaft 268 to surround the holder 306. A cooling agent, which cools the holder 306, each of the wires and the connection mechanism in order to maintain the temperature thereof to be under the predetermined temperature, is flown through the space C1.

Subsequently, the configuration of the connection mechanism between the heater wire 217c (the heater wires 307a, 307b, 308a and 308b) and the heater power supply line 219 (the outer heater power supply line 321, the outer heater power supply line 322, the inner heater power supply line 323, and the inner heater power supply line 324) will be described with reference to FIG. 4.

The first end of the heater wire 217c (a connection point with the heater power supply line 219) includes a planar heater wire connection terminal 217d. A fixing hole 401 is installed in the heater wire connection terminal 217d. Each of the heater wire 217c and the heater wire connection terminal 217d is preferably made of an oxidation-resistant, electrically conductive material, for example, silicon carbide (SiC). The inner part of the shaft base 302 is in an atmosphere containing oxygen, and the inner part of the shaft top 301 cannot be completely air-tight, and is also in the same atmosphere containing oxygen. Therefore, the heater wire 217c and the heater wire connection terminal 217d are preferably made of an electrically conductive material which does not readily oxidize, as described above. The heater wire 217c and the heater wire connection terminal 217d deteriorates when oxidized, which leads to insufficient power supply to the heater 217b. As a result, it is impossible to sufficiently heat the silicon substrate 200.

A first end of the heater power supply line 219 (a connection point with the heater wire connection terminal 217d) includes a planar connection terminal 402. A fixing hole 403 is installed in the connection terminal 402. Each of the heater power supply line 219 and the connection terminal 402 is preferably made of an inexpensive, oxidation-resistant and electrically conductive material such as, for example, iron or nickel.

As a thermal expansion absorption member for connecting the connection terminal 402 with the heater wire connection terminal 217d, a washer 407 is disposed in a contacting surface between the connection terminal 402 and the heater wire connection terminal 217d. The washer 407 is preferably made of an electrically conductive, heat-resistant material, for example a carbon material. While the connection terminal 402, the washer 407 and the heater wire connection terminal 217d overlap one another, a fastening bolt 406 is fastened to a nut 404 via the washer 405 by inserting a shaft of the fastening bolt 406 from the fixing hole 403 of the connection terminal 402 to the fixing hole 401 of the heater wire connection terminal 217d. Here, the heater wire connection terminal 217d and the connection terminal 402 are electrically and physically connected to each other. In general, the connection mechanism between the heater wire 217c and the heater power supply line 219 is constituted by the connection terminal 402, the washer 407, the heater wire connection terminal 217d, the fastening bolt 406, the washer 405, and the nut 404.

According to the above-described configuration, although the heater wire connection terminal 217d and the connection terminal 402 are made of materials having different coefficients of thermal expansion, the washer 407 may absorb the difference in their coefficients of thermal expansion and maintain an electrical connection between the heater wire connection terminal 217d and the connection terminal 402 to supply desired electric power. Also, the damages of the heater wire connection terminal 217d or the connection terminal 402 caused by the thermal stress may be prevented.

However, the washer 407 may be considered to be oxidized since it is made of the carbon material. When the washer 407 is oxidized, the washer 407 itself is deteriorated or deformed by excessive thermal load, which makes it impossible to supply the desired power from the connection terminal 402 to the heater wire connection terminal 217d. Also, temperatures of the devices in the vicinity of the washer 407 may be suddenly increased by a contact failure, resulting in an adverse effect on the devices.

Therefore, in accordance with the embodiment of present invention, when such the temperature exceeds the predetermined temperature, the power supply to the inner heater 504 and the outer heater 501 is adjusted by disposing the second thermocouple 305 adjacent to the holder 306 and controlling the second thermocouple 305 to indirectly detect the temperature of the connection mechanism between the heater wire 217c and the heater power supply line 219 as described above. Such adjustment is performed to prevent the excessive thermal load from being applied to the washer 407.

(2) Method of Manufacturing a Semiconductor Device

Next, as a process of the method of manufacturing a semiconductor device in the substrate processing apparatus according to the present invention, a method of nitriding a gate insulating film formed on the silicon substrate 200 will be described in detail as an example. In accordance with the following description, operations of each unit constituting an MMT apparatus are controlled by the controller 121. Here, a gate insulating film of a capacitor will be exemplified.

(Loading Process of Silicon Substrate)

The wafer lifting pin 266 is passed through the through hole 217a of the susceptor 217 by lowering the susceptor 217 to a transfer position of the silicon substrate 200. As a result, the wafer lifting pin 266 is pushed up to a predetermined height with respect to the surface of the susceptor 217. The gate insulating film of the capacitor is formed on the loaded silicon substrate in advance using a chemical vapor deposition (CVD) or atomic layer deposition (ALD) method using a CVD or ALD apparatus. The gate insulating film is, for example, made of a silicon oxide film.

Next, the gate valve 244 is opened, and the silicon substrate 200 is supported by the wafer lifting pin 266 protruding from the surface of the susceptor 217 using the transfer unit (not shown). Subsequently, the transfer unit is evacuated from the processing chamber 201, and the gate valve 244 is shut off to close the processing chamber 201. Thereafter, the susceptor 217 is lifted using the shaft 268 and the susceptor elevation unit such as a motor (not shown). As a result, the silicon substrate 200 is disposed on the upper surface of the susceptor 217. Thereafter, the silicon substrate 200 is elevated to a substrate processing position.

(Heating Process of Silicon Substrate)

Subsequently, electric power is supplied to the heater 217b embedded inside the susceptor to heat the surface of the silicon substrate 200. A surface temperature of the silicon substrate 200 is preferably set to a temperature higher than a room temperature, for example, a temperature lower than 750° C. (a temperature at which the performances of the devices are deteriorated). More preferably, the surface temperature is preferably ranges from no less than 200° C. to less than 700° C.

The temperature data detected by the first thermocouple 304 is received by the controller 121 during a nitriding process, which will be described later. Based on the temperature data received from the first thermocouple 304, the controller 121 controls the electric power of the power source 218 for heaters so that the silicon substrate 200 can be adjusted to a desired processing temperature.

Also, when the electric power is supplied to the heater 217b, the temperatures of the heater wire 217c, the heater power supply line 219 and the connection mechanism increase, and the temperature of the holder 306 may also increase. In addition, when the temperature of the heater 217b is increased, the temperature of the holder 306 increases by the thermal conduction or radiation. The temperature data of the holder 306 detected by the second thermocouple 305 is received by the controller 121. Based on the temperature data (the temperature of the holder 306) received from the second thermocouple 305, the controller 121 controls the operation of the substrate processing apparatus at 3 levels: Level 1 through Level 3.

(Level 1)

Level 1 is a control process which is performed when the temperature of the holder 306 detected by the second thermocouple 305 is a "first temperature" or higher.

Here, the first temperature is a temperature with possibility of damaging any one of the outer heater 501, the inner heater 504, and the connection mechanism between the heater wire 217c and the heater power supply line 219. Further, the first temperature is not the temperature of the outer heater 501, the inner heater 504, and the connection unit, but the temperature of the holder 306 which linearly conveys the temperature changes thereof. The first temperature may be obtained through experiments. For example, according to the experiment conducted by the inventors, the outer heater 501 or the inner heater 504 made of SiC may be damaged when the temperature of the holder 306 is 310° C. or higher. For example, according to the experiment conducted by the inventors, the washer 407 made of the carbon material may also be damaged when the temperature of the holder 306 is 450° C. or higher. In this case, the lowest temperature (i.e., the temperature of the holder 306 at which the damage of the washer 407 starts: 310° C.) among the experimentally acquired temperatures is preferably set as the first temperature.

When the temperature of the holder 306 is the first temperature or higher, the controller 121 uses a display device or alarm device provided in the substrate processing apparatus to ring an alarm (for example, display "DANGER") so as to call an operator's attention. Also, the controller 121 stops the power supply to the outer heater 501 and the inner heater 504 and the power supply from the high frequency power source 273 to the cylindrical electrode 215 to stop plasma generation and interrupt processing of the production lot which is currently under way. Eventually, the operation of the substrate processing apparatus is stopped.

By performing the control process of Level 1 when the temperature of the holder 306 is the first temperature or higher as described above, the damage of the outer heater 501 or the inner heater 504 and the washer 407 can be prevented, failures of the substrate processing apparatus can be reduced and a term between periodic maintenances period of the substrate processing apparatus can be extended. Further, when the first temperature is set to the lowest temperature among the temperature at which the outer heater 501 or the inner heater 504 can be damaged, and the temperature at which the connection mechanism between the heater wire 217c and the heater power supply line 219 can be damaged, all the damage of the outer heater 501, the inner heater 504, the heater wire 217c, and the heater power supply line 219 can be avoided.

(Level 2)

Level 2 is a control process which is performed when the temperature of the holder 306 is less than the "first temperature" but higher than or equal to "second temperature".

Here, the "second temperature" is a temperature lower than the first temperature wherein the outer heater 501, the inner heater 504, and the connection mechanism between the heater wire 217c and the heater power supply line 219 will probably not be damaged immediately but will deteriorate and increasingly wear out with continuous use, or wherein the parts are being worn out and maintenance is required before the onset of the next production lot. In addition, the second temperature represents the temperature of the holder 306 which linearly conveys the change in temperature of the outer heater 501, the inner heater 504 and the connection unit, rather than temperatures thereof. The second temperature may be obtained by subtracting a predetermined temperature from the first temperature. That is, when the first temperature is set to 310° C., the second temperature may be set to 300° C. obtained by subtracting 10° C. as the predetermined temperature from 310° C. The subtraction of the predetermined temperature may be preferably determined by experiments.

When the temperature of the holder 306 is less than the first temperature but higher than or equal to the second temperature, the controller 121 uses a display device or alarm device provided in the substrate processing apparatus to ring an alarm (for example, display "WARNING" "Information," etc.) so as to call the operator's attention. Also, the controller 121 continues to perform the power supply from the frequency power source 273 to the cylindrical electrode 215 while lowering the electric power of the power source 218 for heaters so as to reduce the temperatures of the outer heater 501 and the inner heater 504. Thereafter, the controller 121 continues to perform the substrate processing operation. When the processing of the current production lot is completed, the operation of the substrate processing apparatus is stopped.

By performing the control process of Level 2 when the temperature of the holder 306 is less than the first temperature but higher than or equal to the second temperature as described above, an operator can be informed in that the outer heater 501, the inner heater 504, and the washer 407 continue to be worn out, and urge the operator to perform the maintenance task. Also, since the substrate processing apparatus is not stopped immediately, a waste of the current production lot can prevented.

(Level 3)

Level 3 is a control process which is performed when the temperature of the holder 306 is less than the "second temperature". When the temperature of the holder 306 is less than the second temperature, the outer heater 501, the inner heater 504, and the connection mechanism between the heater wire 217c and the heater power supply line 219 are unlikely to be damaged immediately. Therefore, the controller 121 continues to perform subsequent substrate processing operations.

(Supply of Reactive Gas)

Hereinafter, a mixture of an ammonia gas and a nitrogen gas as a reactive gas will be described as an example. The mixture of the ammonia gas and the nitrogen gas is introduced in a shower pattern from the gas introduction port 234 into the processing chamber 201. In this case, a supply quantity of the ammonia gas is adjusted to 300 sccm, and a supply quantity of the nitrogen gas is adjusted to 300 sccm.

After the introduction of the mixture of the ammonia gas and the nitrogen gas, an inner pressure of the processing chamber 201 is adjusted to a range of 0.1 to 300 Pa, for example, 30 Pa, using the vacuum pump 246 and the APC 242.

(Excitation of the Mixture of the Ammonia Gas and the Nitrogen Gas)

After the introduction of the mixture of the ammonia gas and the nitrogen Gas, the magnetron discharge is generated in the processing chamber 201 by applying the high frequency power from the high frequency power source 273 to the cylindrical electrode 215 via the matching unit 272 and simultaneously applying the magnetic force formed by the upper magnet 216a and the lower magnet 216b into the processing chamber 201. As a result, the high density plasma is generated in an upper plasma generation region of the silicon substrate 200. In addition, the electric power applied to the cylindrical electrode 215 ranges from 100 to 1,000 W, for example, 800 W. In this case, the impedance variable unit 274 controls a level of impedance to a pre-set impedance value.

(Nitriding Process of the Gate Insulating Film)

When the mixture is in a plasma state as described above, the ammonia gas or the nitrogen gas supplied into the processing chamber 201 is activated to be excited. Thereafter, generated nitrogen radicals (N*) and hydrogen radicals (H*) react with the gate insulating film formed on the silicon substrate 200. During this reaction, a reduction by the hydrogen, and collision and supplement of nitrogen atoms to the surface of the silicon oxide film occurs. As a result, an oxygen component reacts to form water vapor ($H_2O$). In addition, a high-quality gate insulating film having a low leakage current is formed by the introduction of nitrogen into the gate insulating film.

(Exhaust Process of Residual Gas)

When the nitriding process of the silicon oxide film is completed, the power supply to the cylindrical electrode 215 and the gas supply into the processing chamber 201 are stopped. Thereafter, a residual gas in the processing chamber 201 is exhausted using the gas exhaust pipe 231. The susceptor 217 is then lowered to the transfer position of the silicon substrate 200 to support the silicon substrate 200 disposed on the wafer lifting pin 266 protruding from the surface of the susceptor 217. Subsequently, the gate valve 244 is opened, and the silicon substrate 200 is unloaded from the processing chamber 201 using the transfer unit (not shown). Thereafter, the manufacturing of the semiconductor device according to this embodiment is finished.

(3) Effects According to this Embodiment

The embodiment in accordance with the present invention has one or more following effects.

(a) According to the embodiment, the connection mechanism between the heater wire 217c and the heater power supply line 219 is supported by the holder 306. Also, the second thermocouple 305 is disposed on the side surface of the holder 306 away from the connection mechanism. Here, the holder 306 is made of a material which linearly conveys the temperature, for example, ceramics. Therefore, the temperature of the connection mechanism between the heater wire 217c and the heater power supply line 219 can be indirectly detected by detecting the temperature of the holder 306.

Further, according to the embodiment, when the temperatures of the outer heater 501 and the inner heater 504 are increased, the temperature of the holder 306 also increases due to the thermal conduction or radiation. Therefore, the temperature of the outer heater 501 or the inner heater 504 can be indirectly detected by detecting a temperature of the holder 306. For example, the increase in the temperature at which the outer heater 501 or the inner heater 504 can be damaged may be detected by detecting the temperature of the holder 306.

That is, the holder 306 linearly conveys the temperatures of the connection mechanism, the outer heater 501, and the inner heater 504. Therefore, the holder 306 may easily detect (estimate) the temperatures (changes in temperature) of the connection mechanism, the outer heater 501, and the inner heater 504 by detecting the temperature (a change in temperature) of the holder 306 by the second thermocouple 305.

(b) In accordance with the embodiment of present invention, since the second thermocouple 305 is installed in the position away from the connection mechanism (a side surface of the holder 306), the temperature of the holder 306 detected by the second thermocouple 305 is lower than the actual temperature of the connection mechanism. In addition, since the second thermocouple 305 is installed in the position away from the outer heater 501 or the inner heater 504, the temperature of the holder 306 detected by the second thermocouple 305 is lower than the actual temperature of the outer heater 501 or the inner heater 504. Therefore, it is not necessary to use the highly-priced high-temperature thermocouple as the second thermocouple 305, and thus the cost of the substrate processing apparatus can be reduced. Also, since the second thermocouple 305 is used at the lower temperature, the deterioration of the second thermocouple 305 may be prevented and the maintenance task thereof may be carried out without difficulty.

(c) According to the embodiment, when the temperature of the holder 306 detected by the second thermocouple 305, that is, the indirectly detected temperature of the connection mechanism between the heater wire 217c and the heater power supply line 219 exceeds a predetermined temperature, the controller 121 adjusts the power supply to the inner heater 504 and the outer heater 501 so as to decrease the temperature. More specifically, based on the temperature data (the temperature of the holder 306) received from the second thermocouple 305, the controller 121 controls the operation of the substrate processing apparatus at 3 levels: Level 1 through Level 3.

When the temperature of the holder 306 is the first temperature or higher as described above, the controller 121 performs the control process of Level 1. Accordingly, the damages of the outer heater 501, the inner heater 504, and the washer 407 can be avoided, the failures of the substrate processing apparatus can be reduced and the term between periodic maintenances period of the substrate processing apparatus can be extended. Further, when the first temperature is set to the lowest temperature among the temperature at which the outer heater 501 or the inner heater 504 can be damaged, and the temperature at which the connection mechanism between the heater wire 217c and the heater power supply line 219 can be damaged, all the damage of the outer heater 501, the inner heater 504, the heater wire 217c, and the heater power supply line 219 can be avoided.

When the temperature of the holder 306 is less than the "first temperature" and the "second temperature" or higher as described above, the controller 121 performs the above-described control process of Level 2. Therefore, the operator can be informed in that the outer heater 501, the inner heater 504, and the washer 407 continue to be worn out, and urge the operator to perform the maintenance task. Also, since the substrate processing apparatus is not stopped immediately, a waste of the current production lot can prevented.

(d) According to the embodiment, the purge gas supply pipe 314 is installed between the holder 306 and the inner wall of the shaft 268 (specifically, the inner wall of the shaft base 302) in which the holder 306 is installed. The purge gas injected from the purge gas supply hole 314a first purges the surroundings of the connection mechanism between the outer heater power supply lines 321 and 322 and the heater wires 307a and 307b, flows toward the inner heater power supply lines 323 and 324 and then purges the surroundings of the connection mechanism between the inner heater power supply lines 323 and 324 and the heater wires 308a and 308b. As a result, each wire or each connection mechanism is cooled, and oxidation of the connection mechanisms is simultaneously prevented. Further, since each of connection mechanisms or the wires connected to the outer heater 501 are preferentially cooled, the damage of each of the connection mechanisms or the wires connected to the outer heater 501 may be reduced when the electric power of the outer heater 501 is set to a higher power level than that of the inner heater 504.

(e) The holder 306 according to the embodiment includes partitions 323 and 324 installed between the heater power supply lines 219. Even when the wires or the connection mechanisms are damaged, the wires are prevented from coming in contact with adjacent wires by the partitions 323 and 324. That is, the electrical adverse effects caused by the contact with wires (such as the failure caused by excessive current flow) may be prevented.

(f) According to the embodiment, the partition 327, which opposes the flow of the purge gas, is shorter in length than the partition 326 which crosses the partition 327. Therefore, the purge gas cab be effectively supplied to the inner heater power supply line 326 and the inner heater power supply line 327 without interfering with the flow of the purge gas supplied from the purge gas supply hole 314a. Further, the arrangement spaces of the first and second thermocouples 304 and 305 and the wire 310 for electrodes can be secured.

(g) According to the embodiment, as the thermal expansion absorption member for connecting the connection terminal 402 with the heater wire connection terminal 217d, the washer 407 is disposed in a contacting surface between the connection terminal 402 and the heater wire connection terminal 217d. Therefore, although the heater wire connection terminal 217d and the connection terminal 402 are made of different materials, for example, the materials having different coefficients of thermal expansion, the washer 407 may absorb the difference in their coefficients of thermal expansion and maintain the electrical connection between the heater wire connection terminal 217d and the connection terminal 402 to supply desired electric power. Also, the damages of the heater wire connection terminal 217d or the connection terminal 402 caused by the thermal stress may be prevented.

(h) The heater 217b accommodated in the substrate support 500 includes an outer heater 501 as the first heater and an inner heater 504 as the second heater. Each of the outer heater 501 and the inner heater 504 has the ring shape, and concentrically disposed such that the outer heater 501 can be placed in the relatively outer position and the inner heater 504 can be placed in the relatively inner position. Since the outer heater 501 is positioned adjacent to the side surface of the substrate support 500, the heat is easily emitted from the side surface of the substrate support 500. However, since the electric power of the outer heater 501 is set at a higher power level than the inner heater 504, the heat emitted from the side surface of the substrate support 500 is compensated and achieve the uniform in-plane heating of the silicon substrate 200.

(i) According to the embodiment, the first and second thermocouples 304 and 305 may also be disposed on the side surface of the holder 306. That is, in accordance with the embodiment of present invention, in order to dispose the first and second thermocouples 304 and 305 adjacent to each other, through holes may be added to the holder 306 (through holes for the first and second thermocouples 304 and 305 are installed, respectively), which can be carried out easily. Also, since the first and second thermocouples 304 and 305 may share the fixing means, the number of parts can effectively reduced.

(j) According to the embodiment, the space C1, which is defined by the shaft base 302 and the shaft fixing member 303, is also present in the shaft 268 to surround the holder 306. the cooling agent, which cools the holder 306, each of the wires and the connection mechanism in order to maintain the temperature thereof to be under the predetermined temperature, is flown through the space C1.

Another Embodiment of the Present Invention

While the embodiment of the present invention have been described hereinbefore in detail, it should be understood that the present invention is not particularly limited to the above-described embodiment, and changes and modifications may be often made without departing from the scope of the present invention.

For example, while the above-described example has been described wherein the heater 217b includes two heaters (the outer heater 501 and the inner heater 504), the present invention is not particularly limited to such. Therefore, the heater 217b may include at least three heaters.

Further, the present invention is not particularly limited to the above-described example wherein the connection mechanism between the heater wire 217c and the heater power supply line 219 is supported from inside the holder 306. The connection mechanism may be alternately supported in a position spaced apart by a predetermined distance in upward and downward directions from the holder 306. Since each of the heater wire 217c and the heater power supply line 219 is made of a metal material having a high thermal conductivity, the temperature of the holder 306 may be detected in such cases. Therefore, the temperature of the connection mechanism may be indirectly detected.

In addition, while the above-described example has been described wherein the temperature information (the absolute value) is detected by the second thermocouple 305 and the operation of the substrate processing apparatus is controlled based on the absolute value, the present invention is not particularly limited to the above-described example. For example, rather than using the temperature information (the absolute value) from the second thermocouple 305, an increased value (a difference value) of the temperature information may be detected from the second thermocouple 305 and the operation of the substrate processing apparatus may be controlled based on the increased value (the difference value) of the temperature information For example, when the temperature of the connection terminal 402 or the heater wire connection terminal 217d starts to increase from a stable temperature state (approximately 270° C.) to an abnormal level (300° C.), the difference in temperature is approximately 30° C. Here, the temperature information (temperature at the stable state) from the second thermocouple 305 at a normal state is recorded. In this case, when the increased value (the difference value) of the temperature information from the second thermocouple 305 is less than 20° C. compared to the temperature at the stable state, the above-described control process of Level 1 (the continued substrate processing operation) is performed. Also, when the increased value (the difference value) of the temperature information from the second thermocouple 305 is not less than 20° C. but less than 30° C. compared to the temperature at the stable state, the above-described control process of Level 2 (the operation of displaying the alarms to perform the current proceeding process of the production lot only) is performed. Further, when the increased value (the difference value) of the temperature information from the second thermocouple 305 is 30° C. or higher compared to the temperature at the stable state, the above-described control process of Level 1 (the operation of lowering or stopping the power supply to the outer heater 501 and the inner heater 504 to stop the current proceeding process of the production lot) is performed.

As described above, the increased value (the difference value) of the temperature information from the second thermocouple 305, rather than the temperature information (the absolute value) from the second thermocouple 305, is detected and the operation of the substrate processing apparatus is controlled based on the increased value. Therefore, the operation of the substrate processing apparatus is controlled with a superior reproducibility, without affecting an individual difference of the second thermocouple 305 or the substrate processing apparatus.

In accordance the above-mentioned embodiment, the use of the MMT apparatus has been described in detail. However, the present invention is not particularly limited thereto. Therefore, it is possible to use other apparatuses, for example, inductively coupled plasma (ICP) or electron cyclotron resonance (ECR) apparatuses.

Figure 6:
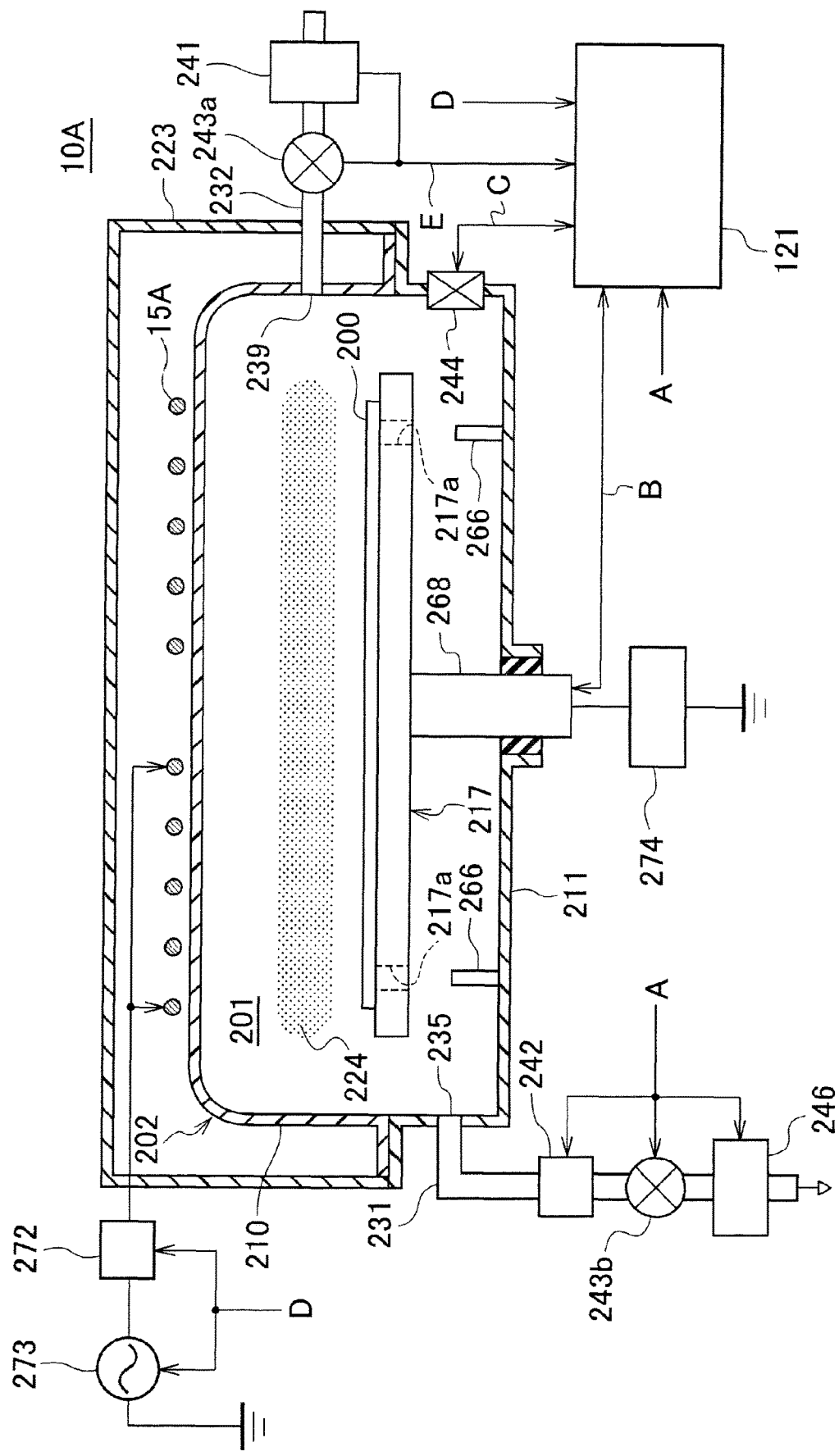
FIG. 6 is a schematic configuration diagram of an ICP type plasma processing apparatus which is a substrate processing apparatus according to another embodiment of the present invention.

FIG. 6 illustrates an ICP-type plasma processing apparatus which is the substrate processing apparatus according to another embodiment of the present invention. A detailed description of the embodiment is omitted by representing like components having the same functions with like reference numerals.

The ICP-type plasma processing apparatus 10A according to another embodiment of the present invention includes an induction coil 15A as a plasma generation unit for generating a plasma by supplying the electric power. The induction coil 15A is provided outside a cell wall of the processing container 203. According to the embodiment, a mixture of the nitrogen gas and the noble gas is supplied from the gas supply pipe 232 into the processing container 203 via the gas discharge port 239. In addition, when the high frequency power flows through the induction coil 15A as the plasma generation unit before/after the gas supply, the electric field is generated by the induction of electrons. The supplied gas is transformed into the plasma using the electric field as an energy source. In this case, an active nitrogen species is generated by the plasma to nitride the gate insulating film on the silicon substrate 200.

Figure 7:
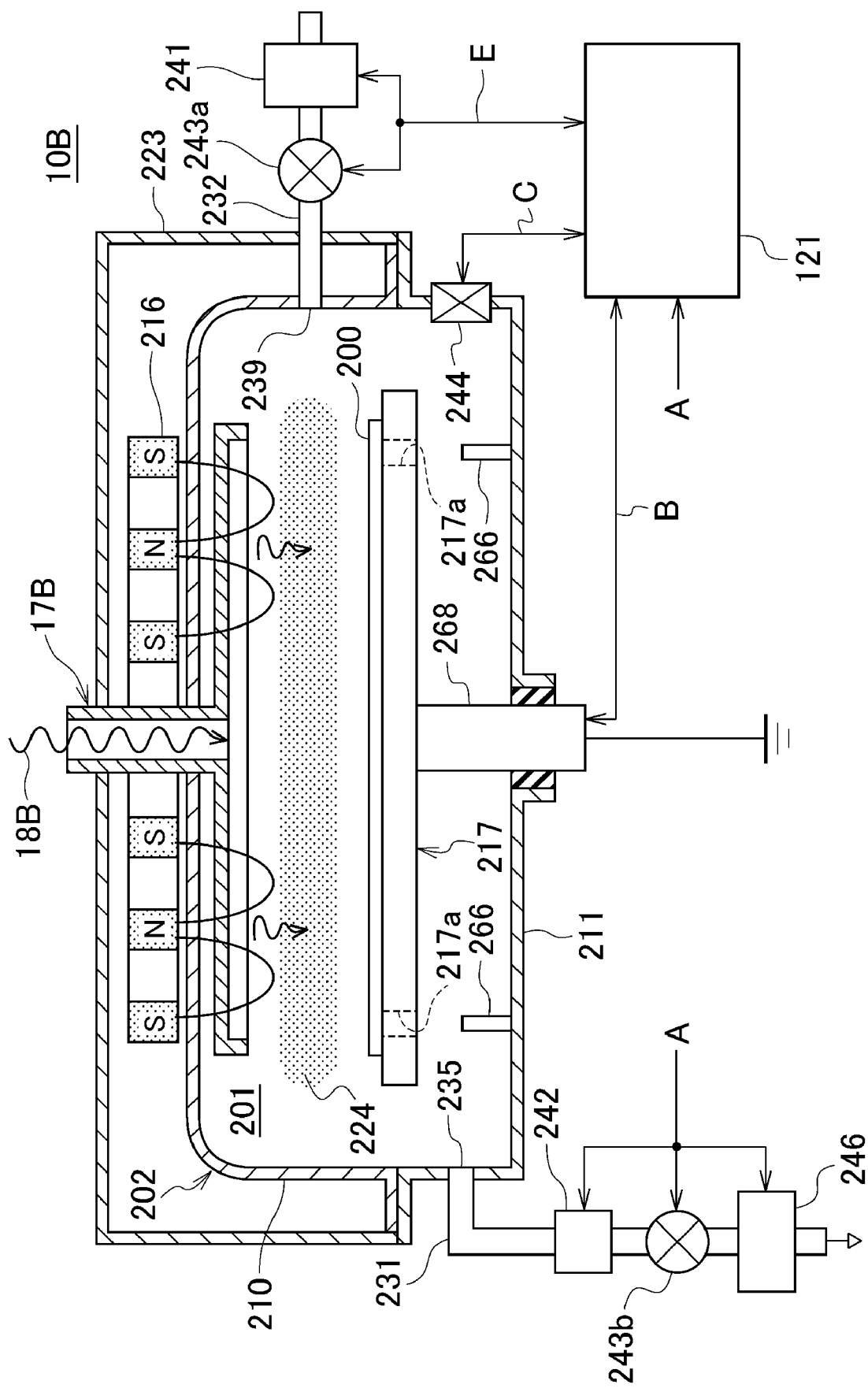
FIG. 7 is a schematic configuration diagram of an ECR type plasma processing apparatus which is a substrate processing apparatus according to yet another embodiment of the present invention.

FIG. 7 illustrates an ECR-type plasma processing apparatus that is the substrate processing apparatus according to yet another embodiment of the present invention. A detailed description of the embodiment is omitted by representing like components having the same functions with like reference numerals.

The ECR-type plasma processing apparatus 10B having an effect on this embodiment includes a microwave introduction pipe 17B as the plasma generation unit for generating the plasma by supplying a microwave. According to the embodiment, a mixture gas of the nitrogen gas and the noble gas is supplied from the gas supply pipe 232 into the processing container 203 via the gas discharge port 239. A microwave 18B is introduced into the microwave introduction pipe 17B as the plasma generation unit before/after the gas supply, and the microwave 18B is then injected into the processing chamber 201. The supplied gas is transformed into plasma using the microwave 18B. In this case, an active nitrogen species is generated by the plasma to nitride the gate insulating film on the silicon substrate 200.

Preferred Embodiments of the Present Invention

Hereinafter, preferred embodiments of the present invention will be described in detail.

According to one embodiment of the present invention, there is provided a substrate processing apparatus including: a processing chamber for processing a substrate; a heater for heating the substrate; a substrate support accommodating the heater and installed inside the processing chamber; a shaft for supporting the substrate support; a wire inserted through the shaft; a supporting unit for holding the wire; and a temperature detector connected to the supporting unit.

Preferably, the wire includes: a heater wire having the heater connected to a first end thereof and a heater power supply line connected to a second end thereof via a connection mechanism; the connection mechanism; and the heater power supply line, and wherein the supporting unit supports the connection mechanism.

Preferably, the heater includes a first heater disposed at an outermost side and a second heater, and wherein a gas supply mechanism is installed between an inner wall of the shaft and the supporting unit, and a distance between the gas supply mechanism and the connection mechanism connected to the first heater is shorter than a distance between the gas supply mechanism and the connection mechanism connected to the second heater.

Preferably, the wire includes a first wire for supplying an electric power to the first heater; and a second wire for supplying the electric power to the second heater, and wherein the supporting unit is provided with a partition installed between the first wire and the second wire.

Preferably, the substrate processing apparatus further includes a controller for controlling a power supply to the heater according to a temperature data detected by the temperature detector.

Preferably, the heater wire and the heater power supply line are made of different materials, and a thermal expansion absorption member is installed between the heater wire and the heater power supply line.

According to another embodiment of the present invention, there is provided a method for manufacturing a semiconductor device using a substrate processing apparatus, the apparatus including a processing chamber for processing a substrate; a heater for heating the substrate; a substrate support accommodating the heater and installed inside the processing chamber; a shaft for supporting the substrate support; a wire inserted through the shaft; a supporting unit for holding the wire; and a temperature detector connected to the supporting unit, the method including steps of: (a) supporting the substrate by the substrate support in the processing chamber; and (b) heating the substrate supported by the substrate support using the heater accommodated in the substrate support, and wherein the temperature detector detects a temperature of the supporting unit during the step (b).

Preferably, a controller is configured to control a power supply to the heater according to a temperature data detected by the temperature detector.

What is claimed is:
1. A substrate processing apparatus comprising:
a processing chamber configured to process a substrate;
a substrate support disposed in the processing chamber;
a first heater and a second heater accommodated in the substrate support and configured to heat the substrate, the first heater being disposed closer to an outer periphery of the substrate support than the second heater;
a shaft supporting the substrate support;
a first wire inserted through the shaft, the first wire comprising a first input-side heater power supply line, a first output-side heater power supply line, a first input-side connection mechanism, a first output-side connection mechanism, a first input-side heater wire having a first end connected to an input terminal of the first heater and a second end connected to the first input-side heater power supply line via the first input-side connection mechanism, and a first output-side heater wire having a first end connected to an output terminal of the first heater and a second end connected to the first output-side heater power supply line via the first output-side connection mechanism;
a second wire inserted through the shaft, the second wire comprising a second input-side heater power supply line, a second output-side heater power supply line, a second input-side connection mechanism, a second output-side connection mechanism, a second input-side heater wire having a first end connected to an input terminal of the second heater and a second end connected to the second input-side heater power supply line via the second input-side connection mechanism, and a second output-side heater wire having a first end connected to an output terminal of the second heater and a second end connected to the second output-side heater power supply line via the second output-side connection mechanism;
a supporting unit supporting the first input-side connection mechanism, the first output-side connection mechanism, the second input-side connection mechanism, and the second output-side connection mechanism in the shaft;
a temperature detector fixed to the supporting unit without contacting the first input-side connection mechanism, the first output-side connection mechanism, the second input-side connection mechanism, and the second output-side connection mechanism and configured to detect a temperature of the supporting unit; and a controller configured to adjust a power supplied to the first heater and the second heater via the first wire and the second wire when the temperature of the supporting unit detected by the temperature detector exceeds a predetermined value such that the temperature is lowered, the supporting unit comprising:

a gas supply mechanism installed inside the shaft wherein a distance between a gas supply hole of the gas supply mechanism and each of the first input-side connection mechanism and the first output-side connection mechanism is shorter than a distance between the gas supply hole and each of the second input-side connection mechanism and the second output-side connection mechanism, wherein a plate-shaped first partition disposed between the first input-side heater power supply line and the second input-side heater power supply line and between the first output-side heater power supply line and the second output-side heater power supply line, wherein the first partition is spaced apart from an inner wall of the shaft to have a first gap between the first partition and the inner wall of the shaft; and a plate-shaped second partition crossing the plate-shaped first partition, the plate-shaped second partition disposed between the first input-side heater power supply line and the first output-side heater power supply line and between the second input-side heater power supply line and the second output-side heater power supply line, wherein the second partition is spaced apart from the inner wall of the shaft to have a second gap between the first partition and the inner wall of the shaft.

2. The substrate processing apparatus according to claim 1, wherein the first input-side connection mechanism comprises a washer disposed at a contacting surface between a heater wire connection terminal at an end of the first input-side heater wire and a connection terminal at an end of the first input-side heater power supply line.

3. The substrate processing apparatus according to claim 2, wherein the washer comprises an electrically conductive and heat-resistant material.

4. The substrate processing apparatus according to claim 1, wherein the temperature detector comprises a thermocouple having a front end fixed to the supporting unit to detect the temperature of the supporting unit.

5. The substrate processing apparatus according to claim 1, wherein the controller is further configured to stop the power supplied to the first heater and the second heater when the temperature of the supporting unit detected by the temperature detector exceeds the predetermined value.

6. The substrate processing apparatus according to claim 1, wherein the first input-side connection mechanism comprises a component made of carbon material.

7. The substrate processing apparatus according to claim 1, wherein the supporting unit is made of ceramics.

8. The substrate processing apparatus according to claim 1, wherein a gas supplied from the gas supply mechanism flows through the first gap and the second gap.

* * * * *